United States Patent
Kanno

(10) Patent No.: US 9,973,010 B2
(45) Date of Patent: May 15, 2018

(54) CONTROL CIRCUIT, RESONANCE CIRCUIT, ELECTRONIC DEVICE, CONTROL METHOD, CONTROL PROGRAM, AND SEMICONDUCTOR ELEMENT

(71) Applicant: DEXERIALS CORPORATION, Tokyo (JP)

(72) Inventor: Masayoshi Kanno, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 156 days.

(21) Appl. No.: 14/900,414

(22) PCT Filed: Jun. 24, 2014

(86) PCT No.: PCT/JP2014/066621
§ 371 (c)(1),
(2) Date: Dec. 21, 2015

(87) PCT Pub. No.: WO2015/005106
PCT Pub. Date: Jan. 15, 2015

(65) Prior Publication Data
US 2016/0141883 A1    May 19, 2016

(30) Foreign Application Priority Data

Jul. 12, 2013 (JP) ................. 2013-146252

(51) Int. Cl.
*H01F 27/42* (2006.01)
*H02J 5/00* (2016.01)
(Continued)

(52) U.S. Cl.
CPC .............. *H02J 5/005* (2013.01); *H02J 7/025* (2013.01); *H02J 50/12* (2016.02); *H03J 3/20* (2013.01)

(58) Field of Classification Search
CPC .. H02J 50/12; H02J 7/025; H02J 5/005; H03J 3/20; H03J 3/32; H03J 3/22; H03H 7/0115; H03H 7/0153; H03H 7/06
(Continued)

(56) References Cited

U.S. PATENT DOCUMENTS

2004/0137865 A1   7/2004   Callias et al.
2012/0307596 A1*  12/2012  Ounadjela .............. G01V 1/159
                                                        367/135
(Continued)

FOREIGN PATENT DOCUMENTS

JP    2004222249 A    8/2004
JP    2008160312 A    7/2008
(Continued)

OTHER PUBLICATIONS

Sep. 30, 2014 International Search Report issued in International Patent Application No. PCT/JP2014/066621.

*Primary Examiner* — Patrick Chen
(74) *Attorney, Agent, or Firm* — Oliff PLC

(57) ABSTRACT

A control circuit, resonant circuit, electronic device, control method, control program, and a semiconductor element, which enable a circuit to be measured and tuned within a short time even in consideration of a time constant when a control voltage is applied to a variable capacitance capacitor. A control circuit for a variable capacitance capacitor includes: a digital-analog converter that outputs a control voltage consisting of a variable DC voltage; the variable capacitance capacitor that has a capacitance varying with an application of the control voltage; a phase detector that acquires a characteristic of a circuit containing the variable capacitance capacitor; an analog-digital converter that subjects an analog signal from the phase detector to a digital conversion; a comparing section that compares a target value with a detected value; and a control section that sets (Continued)

the control voltage for the digital-analog converter on the basis of the comparison result.

25 Claims, 13 Drawing Sheets

(51) Int. Cl.
  *H03J 3/20* (2006.01)
  *H02J 7/02* (2016.01)
  *H02J 50/12* (2016.01)
(58) Field of Classification Search
  USPC .......................................................... 307/104
  See application file for complete search history.

(56) References Cited

U.S. PATENT DOCUMENTS

2013/0010502 A1* 1/2013 Chen .................... H02M 3/3387
  363/21.02
2013/0147561 A1* 6/2013 Chaivipas ............... H03L 7/146
  331/34

FOREIGN PATENT DOCUMENTS

| JP | 2012099968 A | 5/2012 |
| WO | 2013027318 A1 | 2/2013 |

* cited by examiner

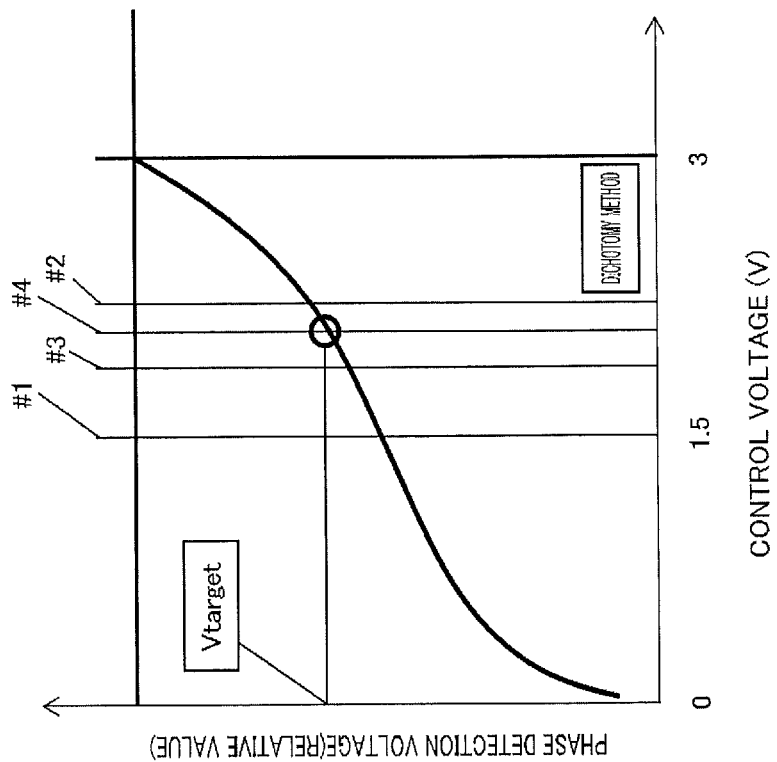
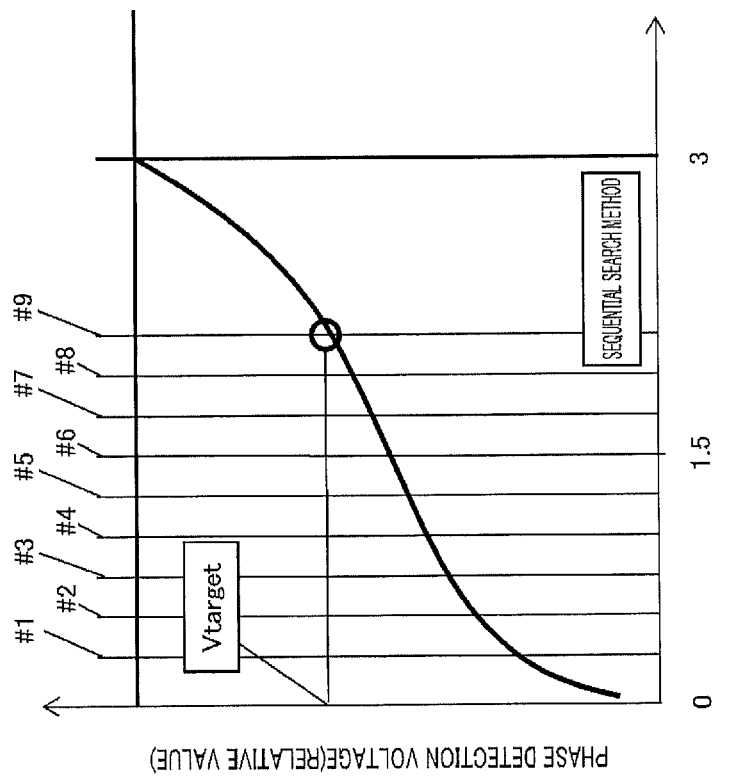
FIG.4A
FIG.4B

CONTROL CIRCUIT, RESONANCE CIRCUIT, ELECTRONIC DEVICE, CONTROL METHOD, CONTROL PROGRAM, AND SEMICONDUCTOR ELEMENT

BACKGROUND OF THE INVENTION

Field of the Invention

The present invention relates to a control circuit for a variable capacitance element whose capacitance varies with the application of a DC voltage, a resonant circuit including the control circuit, an electronic device, a control method for the variable capacitance element, a control program, and a semiconductor element having the control program. This application is based upon and claims the benefit of priority from the Japanese Patent Application No. 2013-146252 filed in Japan on Jul. 12, 2013, the entire contents of which are incorporated herein by reference.

Description of Related Art

Noncontact communication technology utilizing electromagnetic induction has been increasingly applied to IC cards, including FeliCa™, Mifare™, and NFC (Near Field Communication). The application of this noncontact communication technology is now spreading even to noncontact charging (power feeding) techniques represented by a Qi format, for example.

When noncontact communication is conducted between a noncontact IC card and a reader/writer as well as when noncontact charging in which a relatively large amount of electric power is fed or received is performed, the signal transmission or the power feeding utilizes electromagnetic coupling and a magnetic resonance phenomenon. In such coupling systems, the resonant frequency matching between the resonant circuits on the transmitting and receiving sides is directly linked to a decrease in the number of transmission errors or an improvement in the transmission efficiency. On the other hand, the resonant frequencies of the resonant circuits on the transmitting and receiving sides may vary and fluctuate due to various factors. The capacitances of capacitors and the inductances of coils used in a resonant circuit have initial manufacturing variations, and these variation ranges may be widened because these capacitors and coils each have temperature characteristics according to heat generated during an operation and a surrounding temperature change. Furthermore, the resonant frequency may vary depending on a placement condition of a resonant circuit mounted in a transmitter or a receiver used. A relative positional relationship between the resonant circuits on the transmitting and receiving sides may also influence the transmitting condition.

The resonant frequencies of constituent elements of a resonant circuit are individually tuned before shipping so that the characteristics, including temperature characteristics, of the constituent elements can fall within predetermined ranges. It is, however, extremely difficult to design the circuit in consideration of varying resonant frequencies when the circuit is used. Even when certain levels of initial variations in elements are recognized, excessively reducing these initial variations could not be preferred, because the excessive reduction in the variations may lead to an increase in a material cost and complexity of a manufacturing process.

For the purpose of correcting a variation in a resonant frequency of a resonant circuit and reducing an influence of the variation in the resonant frequency in use, techniques have been studied to automatically tune the resonant frequency on each of the transmitting and receiving sides or automatically tune the resonant frequencies on both the transmitting and receiving sides.

To give some examples, Patent Literature 1 describes a method in which resonant capacitors are mounted in a resonant circuit and a semiconductor switch is used to tune the capacitances of the resonant capacitors such that the resonant circuit has a desired resonant frequency. Patent Literature 2 describes a method in which a variable capacitance capacitor having a ferroelectric thin film is used as a constituent resonant capacitor in a resonant circuit and the capacitance of the resonant capacitor is controlled using an external DC bias such that the resonant circuit has a desired resonant frequency. Moreover, Patent Literature 2 describes a method in which the phase difference between input and output signals of a resonant coil is used to sense the tuned resonant frequency of the resonant circuit and the resonant frequency can thereby be tuned easily without detecting the peak of an analog signal.

Patent Literature 1: JP 2008-160312 A
Patent Literature 2: JP 2012-099968 A

BRIEF SUMMARY OF THE INVENTION

In the technique described in Patent Literature 1, the resonant frequency needs to be tuned discretely. Therefore, it may be difficult to tune the resonant frequency to a desired one, for example when constituent elements of the resonant circuit have considerable initial variations.

The technique described in Patent Literature 2 enables a resonant frequency to be continuously tuned, advantageously obtaining a desired resonant frequency easily. In the technique described in Patent Literature 2, however, when the target of the resonant frequency is searched for, a control voltage is applied to the variable capacitance capacitor while being elevated in a stepwise manner with the step voltage widths fixed. Therefore, as the number of steps for the step voltage width increases, the target can be acquired with higher accuracy, but the tuning time is disadvantageously prolonged because the tuning time is proportional to the number of steps.

In addition to the sequential search method in which a control voltage is elevated in a stepwise manner with the step widths fixed, a dichotomy method is known. In this dichotomy method, a target is narrowed down by first changing a control voltage in wide steps and then sequentially halving the range of the control voltage in steps. Employing the dichotomy method could be expected to shorten the time for measuring and tuning the resonant frequency.

In addition to supplying transmission and reception AC signals, a DC bias needs to be applied to the variable capacitance capacitor in a resonant circuit whose resonant frequency is tunable, in order to vary the capacitance. To apply a DC voltage to the variable capacitance capacitor separately from an AC signal, high-value bias resistors for AC blocking need to be placed at terminals of the variable capacitance capacitor. However, if a DC control voltage is applied to the variable capacitance capacitor in order to tune the resonant frequency, the capacitance of the variable capacitance capacitor and the bias resistors for AC blocking may create a long time constant. In this case, it is necessary to measure the resonant frequency after the lapse of a wait time that is sufficiently longer than the time constant. This is because the resonant frequency may be unable to be measured accurately before the control voltage applied to the variable capacitance capacitor is stabilized. Reserving a long wait time enables the resonant frequency to be measured accurately but may have a problem in that a time for converging to the target is prolonged in accordance with the number of steps.

An object of the present invention is to provide a control circuit, a resonant circuit, an electronic device, a control method, a control program, and a semiconductor element, all of which enable a circuit to be measured and tuned within a short period of time even in consideration of a time constant when a control voltage is applied to a variable capacitance capacitor.

A control circuit, according to an embodiment of the present invention, for a variable capacitance element, which acts as means for addressing the above problem, includes: a control voltage output section that outputs a control voltage generated from a variable DC voltage; a variable capacitance element that has a capacitance varying with an application of the control voltage; and a detection section that acquires a characteristic of a circuit containing the variable capacitance element. The detection section has a wait time between when the control voltage is applied to the variable capacitance element and when a measurement of the characteristic of the circuit is acquired. The wait time is set to a plurality of values in accordance with the control voltage.

A resonant circuit according to an embodiment of the present invention includes a control circuit for a variable capacitance element and a resonant coil connected to the control circuit. The control circuit includes: a control voltage output section that outputs a control voltage generated from a variable DC voltage; a variable capacitance element that has a capacitance that varies with an application of the control voltage; and a detection section that acquires a characteristic of a circuit containing the variable capacitance element. The detection section has a wait time between when the control voltage is applied to the variable capacitance element and when a measurement of the characteristic of the circuit is acquired. The wait time is set to a plurality of values in accordance with the control voltage.

An electronic device according to an embodiment of the present invention includes a control circuit for a variable capacitance element. The control circuit includes: a control voltage output section that outputs a control voltage generated from a variable DC voltage; a variable capacitance element that has a capacitance varying with an application of the control voltage; and a detection section that acquires a characteristic of a circuit containing the variable capacitance element. The detection section has a wait time between when the control voltage is applied to the variable capacitance element and when a measurement of the characteristic of the circuit is acquired. The wait time is set to a plurality of values in accordance with the control voltage.

A control method, according to an embodiment of the present invention, for a variable capacitance element includes: setting a capacitance of a variable capacitance element by applying a control voltage with a control voltage output section that outputs a variable DC voltage; and measuring a characteristic of a circuit containing the variable capacitance element with a detection section that detects the characteristic of the circuit containing the variable capacitance element. The detection section has a wait time between when the control voltage is applied to the variable capacitance element and when a measurement of the characteristic of the circuit is acquired. The wait time is set to a plurality of values in accordance with the control voltage.

According to an embodiment of the present invention, a control program for a variable capacitance element is a control program that has steps to be executable by a computer. The computer includes a storage section that stores a program and a processing section that expands and executes the stored program. The control program includes the steps of: setting a capacitance of a variable capacitance element by applying a control voltage with a control voltage output section that outputs a variable DC voltage; and acquiring a characteristic of a circuit containing the variable capacitance element with a detection section that detects the characteristic of the circuit containing the variable capacitance element. The detection section has a wait time between when the control voltage is applied to the variable capacitance element and when a measurement of the characteristic of the circuit is acquired. The wait time is set to a plurality of values in accordance with the control voltage.

A semiconductor element according to an embodiment of the present invention includes a storage section that stores a control program for a variable capacitance element. The semiconductor element further includes a processing section that executes the control program stored in the storage section.

With the present invention, a wait time between when a control voltage is applied to a variable capacitance element and when a measurement of a characteristic of a circuit is acquired is set to a plurality of values in accordance with the control voltage. Thus, the present invention enables a measurement of the characteristic of the circuit to be acquired within a short wait time.

BRIEF DESCRIPTION OF THE SEVERAL VIEWS OF THE DRAWINGS

FIG. 4A is a graph that indicates how many steps are required to search for a target value with the sequential search method.

FIG. 4B is a graph that indicates how many steps are required to search for a target value with the dichotomy method.

In FIG. 11A, the improved dichotomy method (dichotomy method 1) is compared with the normal dichotomy method; in the dichotomy method 1, the maximum step voltage width is set to ½ of the maximum of the control voltage, and a wait time for other step voltage widths is uniformly set. In FIG. 11B, the wait time is set in proportion to step voltage widths as an improved dichotomy method 2. In FIG. 11C, the wait time is set in proportion to step voltage widths as an improved dichotomy method 3, and the wait time for the falling portion of the control voltage is set to be shorter than the wait time for the rising portion of the control voltage.

DETAILED DESCRIPTION OF THE INVENTION

Some embodiments of the present invention will be described below in detail with reference to the accompanying drawings. Needless to say, the present invention is not limited to embodiments that will be described below, and these embodiments can be modified in various ways without departing from the spirit of the present invention.

Figure 1:
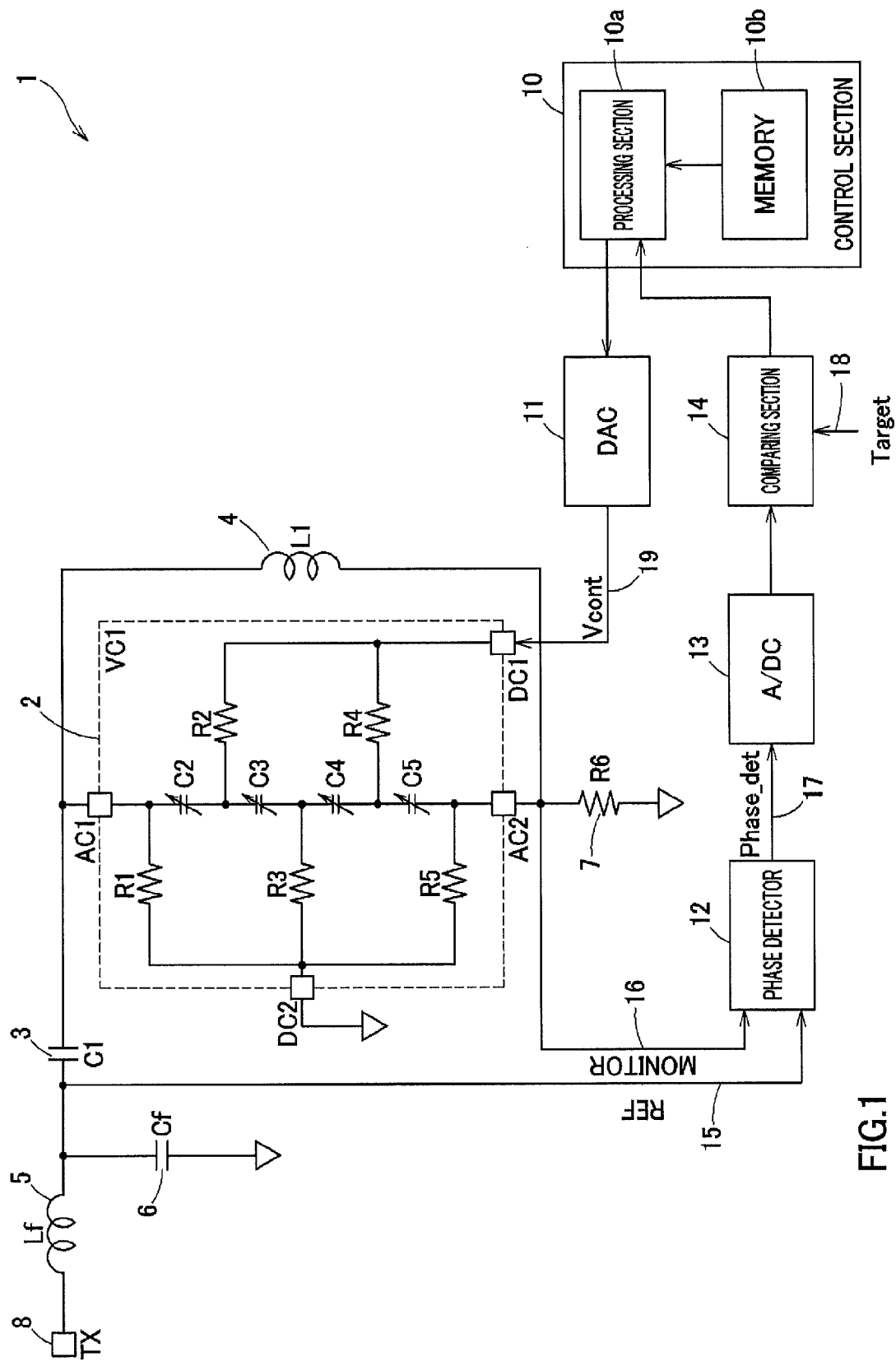
FIG. 1 is a block diagram of an exemplary control circuit for a variable capacitance capacitor according to an embodiment employing the present invention.

The description will be given in the following order.
1. Exemplary Configuration of Control Circuit that Controls Resonant Frequency
2. Principle of Operation of Control Circuit
3. Operation Sequence of Control Circuit
4. Exemplary Operation of Control Circuit
5. Exemplary Configuration of Electronic Device
1. Exemplary Configuration of Control Circuit that Controls Resonant Frequency As illustrated in FIG. 1, a control circuit (referred to below simply as a control circuit) 1 according to an embodiment employing the present invention controls a resonant frequency. The control circuit 1 includes a resonating section having a variable capacitance capacitor (VC1) 2 that forms a resonant capacitor, a resonant coil (L1) 4 connected in parallel to the variable capacitance capacitor (VC1) 2, and a series resonant capacitor (C1) 3 connected in series to the resonant coil (L1) 4. In addition, the control circuit 1 includes: a digital-analog converter (referred to below simply as a DAC) 11 that applies a control voltage (Vcont) 19 to the variable capacitance capacitor (VC1) 2; a phase detector 12 that receives input and output signals for the resonating section and detects the phase difference therebetween; an analog-digital converter (referred to below simply as an A/DC) 13 that converts an output signal (Phase_det) 17 forming a phase difference signal detected by the phase detector 12 into a digital signal; and a comparing section 14 that compares a digital value of the output signal (Phase_det) 17 with a preset target value (Target) 18.

The control circuit 1 further includes a control section 10 that directs the DAC 11 to set a next control voltage 19 to be applied to the variable capacitance capacitor (VC1) 2 via the DAC 11, on the basis of the comparison result from the comparing section 14. When the DAC 11 sets a voltage value of the control voltage 19, the control section 10 directs the DAC 11 to output the control voltage 19 after the elapse of a preset wait time. The control section 10 preferably has a processing section 10a formed of an APU, and the processing section 10a preferably reads and executes individual steps in a program stored in a memory 10b. The processing section 10a and the memory 10b may be implemented using an integrated semiconductor device. Alternatively, the processing section 10a may be implemented using an MPU or a microcontroller, and the memory 10b may be implemented using a ROM, a RAM, a magnetic memory, or a combination thereof.

Before an input signal enters a resonating section of the control circuit 1, the input signal preferably passes through a filter circuit formed of a coil (Lf) 5 and a capacitor (Cf) 6 so that only a predetermined frequency component passes therethrough.

When an AC signal having a frequency f0 enters the control circuit 1 via a signal input terminal (TX) 8, the AC signal enters the resonating section constituted by the series resonant capacitor (C1) 3, the variable capacitance capacitor (VC1) 2, and the resonant coil (L1) 4. Then, the control voltage (Vcont) 19 output from the DAC 11 is adjusted such that a resonant frequency f1 of the resonating section matches the frequency f0 of the input signal. The frequency difference between the frequencies f0 and f1 is measured with the phase detector 12. Signals to enter the phase detector 12 are an input signal (REF) 15 to enter the resonating section and an output signal (MONITOR) 16 formed of a current signal that has flown through the resonating section. The output signal (MONITOR) 16 is converted into a voltage signal by a current sensing resistor (R6) 7 connected to the resonating section, and this voltage signal is detected. The phase detector 12 outputs the output signal (Phase_det) 17 in accordance with the phase difference between the input signal (REF) 15 and the output signal (MONITOR) 16. Then, the control section 10 adjusts the control voltage (Vcont) 19 to be output from the DAC 11 until the output signal (Phase_det) 17 and the target value (Target) 18 are compared and match each other or a compared value becomes equal to or less than the resolution of the A/DC 13.

Figure 2A:
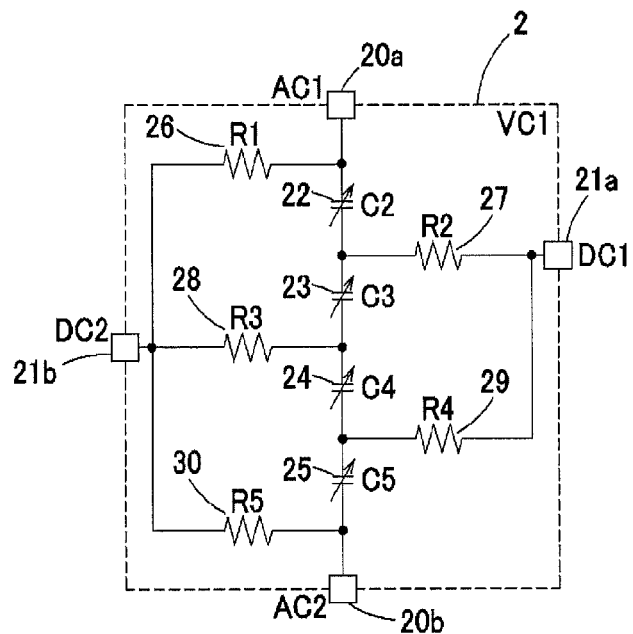
FIG. 2A is a circuit diagram that is an exemplary circuit configuration of the variable capacitance capacitor.
Figure 2B:
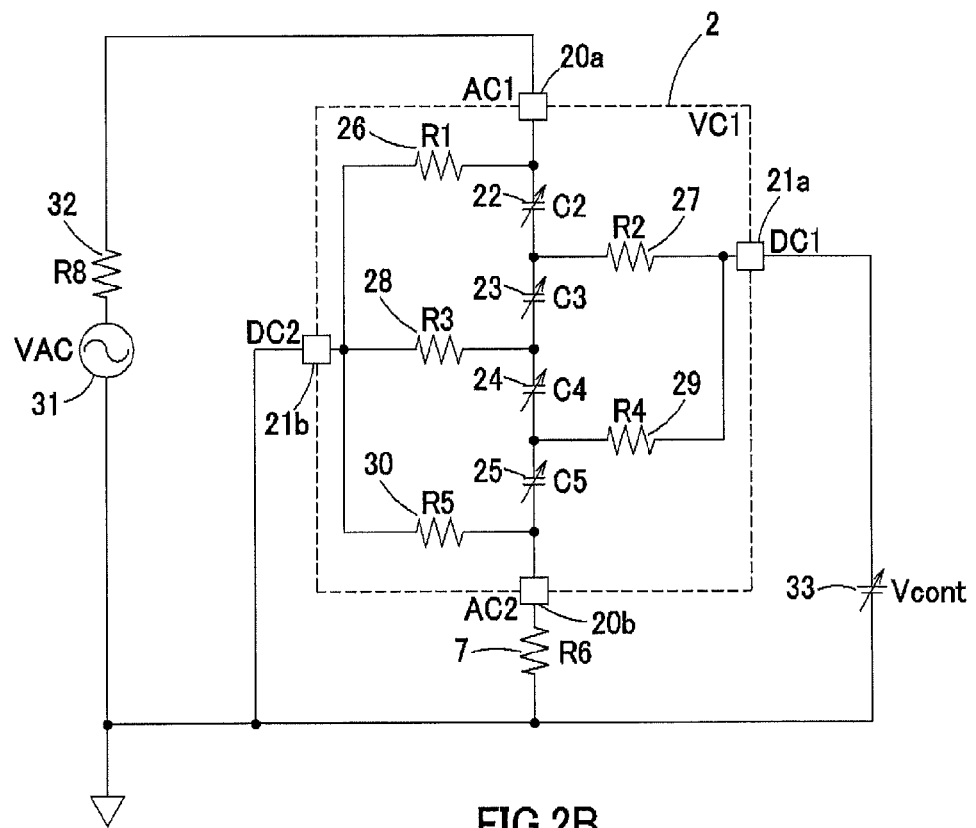
FIG. 2B is a circuit diagram of the variable capacitance capacitor, including a signal source connected to the terminals.

FIGS. 2A and 2B illustrate exemplary configurations of the variable capacitance capacitor (VC1) 2. As illustrated in FIG. 2A, the variable capacitance capacitor (VC1) 2 has four variable capacitance elements (C2 to C5) 22 to 25 connected in series between two AC input terminals (AC1 and AC2) 20a and 20b. The number of variable capacitance elements connected in series should be selected appropriately in accordance with a withstand voltage required for a circuit, and may be more than four or less than four. Alternatively, a single variable capacitance element may be used. The variable capacitance elements (C2 to C5) 22 to 25 typically have the same capacitance; however, it is obvious that there is no limitation on the capacitances of the variable capacitance elements (C2 to C5) 22 to 25.

The variable capacitance capacitor (VC1) 2 may be fabricated by laminating a plurality of layers, each of which includes a ferroelectric thin film made of barium titanate, for example, and metal electrodes formed on the ferroelectric thin film with vapor deposition.

The capacitance of the variable capacitance capacitor (VC1) 2 can vary with the application of a DC bias to the variable capacitance elements (C2 to C5) 22 to 25. The DC bias voltage is applied between DC input terminals (DC1 and DC2) 21a and 21b. In this case, the same DC bias voltage cannot be applied directly between the end electrodes of each of the variable capacitance elements (C2 to C5) 22 to 25, because the electrodes may be shorted. Therefore, the DC bias voltage is applied between the end electrodes of each variable capacitance element via impedance elements; each impedance element has an impedance that is sufficiently larger than the impedance of each variable capacitance element which corresponds to the frequency of the AC signal applied to the variable capacitance elements (C2 to C5) 22 to 25. More specifically, the DC input terminals (DC1 and DC2) 21a and 21b are connected to the end electrodes of variable capacitance element (C2) 22 via high-value resistors (R2 and R1) 27 and 26, respectively. Likewise, the DC input terminals (DC1 and DC2) 21a and 21b are connected to the end electrodes of the variable capacitance element (C3) 23 via the high-value resistors (R2) 27 and a high-value resistors (R3) 28, respectively. The DC input terminals (DC1 and DC2) 21a and 21b are connected to the end electrodes of the variable capacitance element (C4) 24 via a high-value resistor (R4) 29 and the high-value resistor (R3) 28, respectively. The DC input terminals (DC1 and DC2) 21a and 21b are connected to the end electrodes of the variable capacitance element (C5) 25 via the high-value resistor (R4) 29 and a high-value resistor (R5) 30. With this connection, the same level of DC bias voltages are applied to the end electrodes of all the variable capacitance elements (C2 to C5) 22 to 25.

As illustrated in FIG. 2B, the AC input terminals (AC1 and AC2) 20a and 20b of the variable capacitance capacitor (VC1) 2 are connected to the AC signal source (VAC) 31. To measure the current flowing through the variable capacitance capacitor (VC1) 2, the current sensing resistor (R6) 7 may be connected between the AC input terminal (AC2) 20b and the AC signal source (VAC) 31. The output impedance of the AC signal source (VAC) 31 corresponds to a resistor (R8) 32. The DC input terminals (DC1 and DC2) 21a and 21b of the variable capacitance capacitor (VC1) 2 are connected to a control voltage source (Vcont) 33 that outputs a variable DC bias voltage. In FIG. 2B, a positive voltage potential is applied to the DC input terminal (DC1) 21a, whereas a negative voltage potential is applied to the DC input terminal (DC2) 21b. However, it is obvious that the connection may be reversed because the variable capacitance capacitor has no polarity, and thus the connection can be set in accordance with an application circuit.

An exemplary configuration of a control circuit to be mounted in a noncontact communication device, for example, has been described; the control circuit controls the resonant frequency of a resonant circuit having a variable capacitance capacitor as a resonant capacitor. However, it is obvious that this configuration is also applicable to other control circuits that control the capacitance of the variable capacitance capacitor with a control voltage via an AC blocking resistor and tunes characteristics of a circuit including the variable capacitance capacitor. When the control circuit is used as that for another control circuit, a characteristic value to be detected may be a resonant frequency, a circuit impedance, or some other circuit characteristic. A configuration of a detection circuit can be selected and configured depending on a circuit characteristic to be detected.

Figure 3:
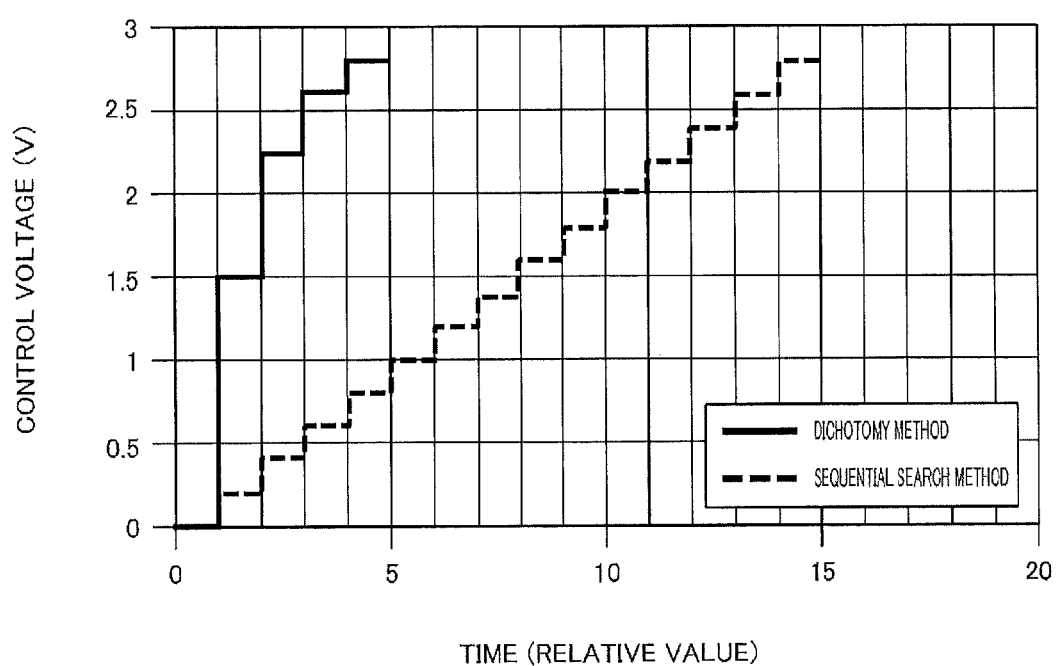
FIG. 3 is a graph that indicates the comparison between times for measuring a target value with a dichotomy method and a sequential search method.

2. Principle of Operation of Control Circuit
(1) Principle of Operation of Dichotomy Method FIG. 3 conceptually illustrates the difference between the measuring times when the target value of a control voltage is searched for with the dichotomy method and the sequential search method. FIG. 3 illustrates an exemplary case where the target value is in the range of 2.5 V to 3 V. When the sequential search method represented by a broken line is used, a time period corresponding to 15 time units (relative time units) is required. In contrast, when the dichotomy method is used, a time period corresponding to 5 time units is required. Thus, the dichotomy method makes it possible to search for a target value within 1/3 of the measuring time for the sequential search method.

When the target value is in the vicinity of 2.7 V as illustrated in FIG. 3, the target value is searched for in the following manner with the dichotomy method.

It is determined that the target value is higher or lower than 1.5 V that is 1/2 of the maximum voltage, or 3 V. If the target value is higher, the target value is considered to fall within the range of 1.5 V to 3 V, and the determination range shifts to the next one. The next determination range is the range of 1.5 V to 2.25 V (=1.5 V+(3 V−1.5 V)/2), and it is determined whether the target value is higher or lower than 2.25 V. If it has been determined that the target value is higher than 2.25 V, the target value falls within the range of 2.25 V to 2.625 V (=2.25 V+(3 V−2.25 V)/2), and it is determined whether the target value is higher or lower than 2.625 V. If the target value has been higher than 2.625 V, the next determination range is the range of 2.625 V to 2.8125 V (=2.625 V+(3 V−2.625 V)/2), and the target value is concluded to fall within the range of 2.8125 V to 3 V.

In the above way, the search range of the control voltage is halved in steps so that the range in which the target value is present is narrowed. Consequently, it is possible to reach the target value through a small number of steps and within a short time period.

FIGS. 4A and 4B conceptually illustrate how to reach a target value (Vtarget) on an actually measured characteristic curve (e.g., the phase detection voltage (Phase_det) associated with the control voltage (Vcont) in the control circuit of FIG. 1), together with a difference between the sequential search method and the dichotomy method.

In the sequential search method, as illustrated in FIG. 4A, the phase detection voltage, which is a target to be measured, is measured in step voltage widths (e.g., in steps of an LSB of the DAC) obtained by equally dividing the maximum value of the control voltage, or 3 V. In FIG. 4A, the step increment is repeated nine times and then the target value Vtarget is reached.

In the dichotomy method, as illustrated in FIG. 4B, the measurement starts at 1.5 V, which is 1/2 of the maximum value of the control voltage, or 3 V, and the target value Vtarget is reached through four steps.

(2) Problem with Dichotomy Method

As illustrated in FIGS. 1 and 2, when tuning the capacitance of the variable capacitance capacitor (VC1) 2, the control section 10 applies the control voltage (Vcont) 19 to the electrodes of the variable capacitance elements (C2 to C5) 22 to 25 via the high-value resistors (R1 to R5) 26 to 30.

In this case, when the control voltage (Vcont) 19 is applied between the DC input terminals (DC1 and DC2) 21a and 21b in a stepwise manner, a considerable time period is required for the control voltage (Vcont) 19 to reach a desired constant voltage. This is because the change in the control voltage (Vcont) 19 depends on a time constant determined by the product of the capacitances of variable capacitance elements (C2 to C5) 22 to 25 and the resistances of the resistors for AC blocking (R1 to R5) 26 to 30. Assuming that the variable capacitance elements (C2 to C5) 22 to 25 have the same capacitance (C2 to C5=C) and the resistor for AC blocking (R1 to R5) 26 to 30 have the same resistance (R1 to R5=R), the time constant $\tau$ is equal to 2CR because the resistor for AC blocking is connected across each variable capacitance element.

In general, when a variable capacitance capacitor having a ferroelectric thin film is used in a resonant circuit in a noncontact communication system or a transmitting/receiving antenna of a noncontact charging system, the resonant circuit includes a plurality of variable capacitance elements connected in series in order to sufficiently increase an in-use withstand voltage. If the resistors for AC blocking (R1 to R5) 26 to 30 each have a low resistance, an AC signal that has entered the AC input terminals (AC1 and AC2) 20a and 20b may flow out to the DC input terminals (DC1 and DC2) 21a and 21b. Furthermore, the AC signal may flow while bypassing the resistors for AC blocking, thereby increasing a loss. The increase in the loss may result in the lowering of the Q (quality factor) of the resonant circuit.

For the above reason, the resistance of each of the resistors for AC blocking (R1 to R5) 26 to 30 is set to a large value. As a result, r=2CR increases. The increase in $\tau$ may result in an extension of a measuring time, even when the target value is searched for with the dichotomy method.

(3) Improvement in Dichotomy Method

To address the above problem, the inventor of the present invention found a predetermined relationship between a time constant determined by the capacitance of a variable capacitance capacitor and the resistance of a resistor for AC blocking and a step voltage width to be applied. From the above relationship, then, the inventor derived improved dichotomy methods that enable short-time measurement.

Figure 5:
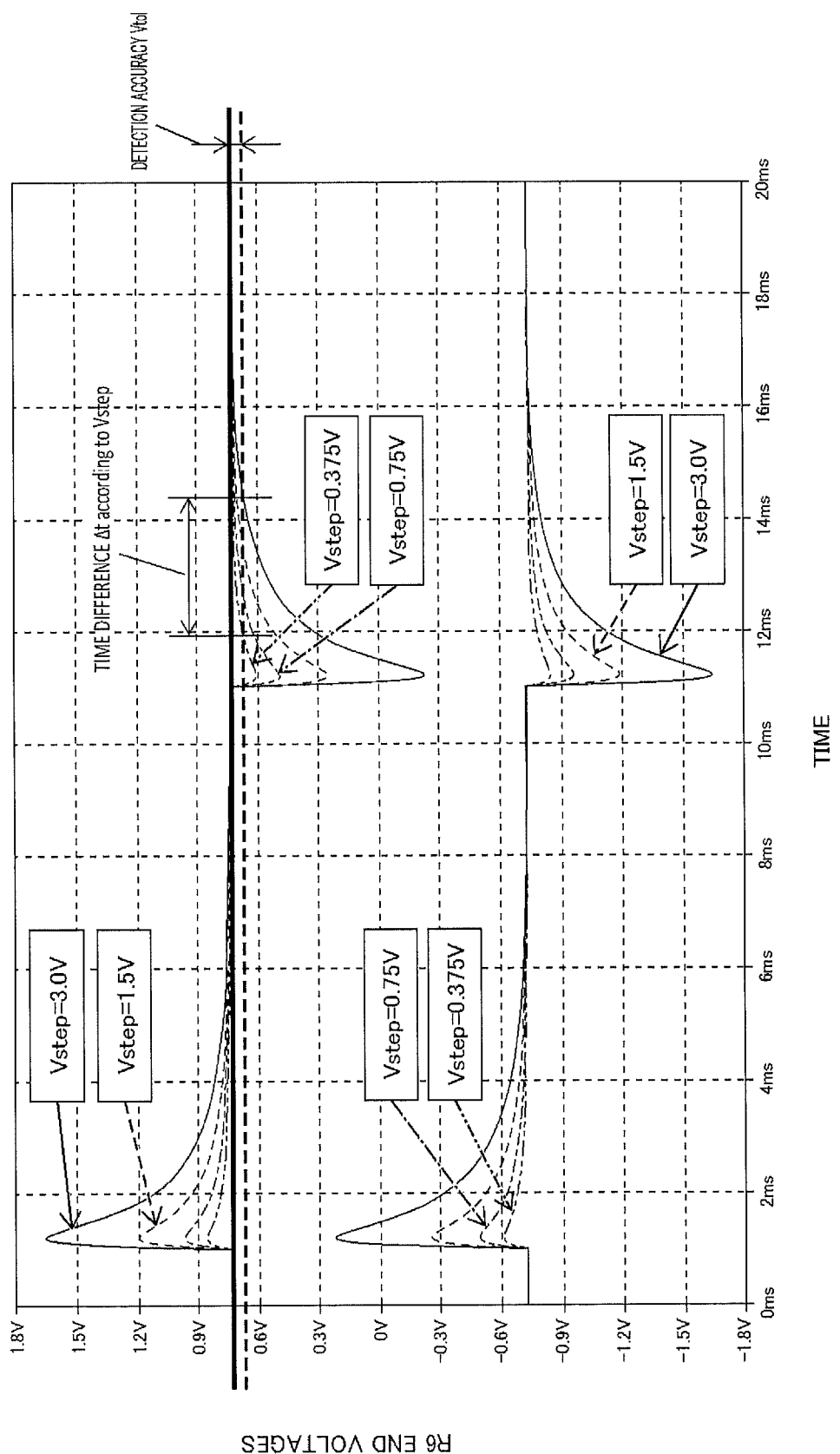
FIG. 5 is a graph that displays a waveform of measurements of a current flowing through the variable capacitance capacitor in the circuit of FIG. 2B, and is a graph that charts a measurement of a time period over which the current converges into a constant value when step voltage widths of a control voltage applied to the DC input terminals of the variable capacitance capacitor are changed.

FIG. 5 illustrates waveforms of voltages across the current sensing resistor (R6) 7 (i.e., the waveforms of currents flowing through the variable capacitance capacitor (VC1) 2) when the control voltage (Vcont) in the circuit of FIG. 2B is changed in a stepwise manner. The waveforms of FIG. 5 are obtained when the step voltage width of the control voltage (Vcont) is changed to 0.375 V, 0.75 V, 1.5 V, and 3.0 V. As the step voltage width increases, a time for converging to a constant voltage is prolonged. Assuming that a range in which the control voltage (Vcont) 33 can be recognized as a constant voltage (initial current) is considered to be a voltage value considering a detection accuracy Vtol of a measuring system and a time period between when the application of a step voltage starts and when the control voltage (Vcont) 33 becomes a constant voltage is defined as a stabilization time, a stabilization time difference $\Delta t$ is present between the stabilization times when the step voltage width is 0.375 V and 3.0 V.

Figure 6:
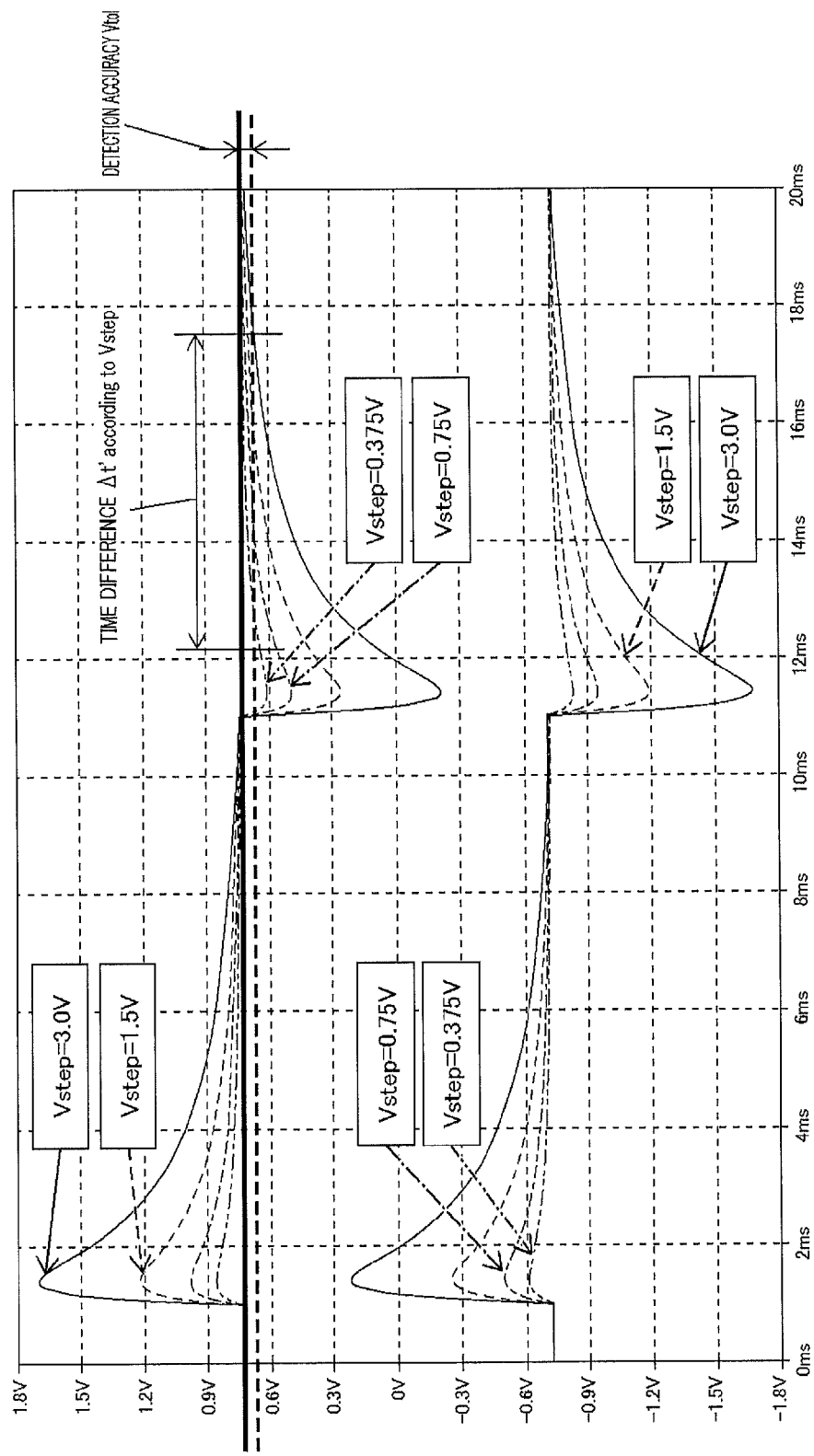
FIG. 6 is a graph that displays a waveform of measurements of a current flowing through the variable capacitance capacitor in the circuit of FIG. 2B with a time constant set to twice of the time constant in FIG. 5, and is a graph that charts a measurement of a time period over which the current converges into a constant value when the step voltage widths of the control voltage applied to the DC input terminals of the variable capacitance capacitor are changed.

FIG. 6 illustrates voltage waveforms across the current sensing resistor (R6) 7 (i.e., current waveforms flowing through the variable capacitance capacitor (VC1) 2) when the control voltage (Vcont) in the circuit of FIG. 2B is changed in a stepwise manner with a time constant that is twice as long as the time constant of FIG. 5. A stabilization time difference $\Delta t'$ in step voltage width is remarkably greater than the stabilization time difference $\Delta t$ in the case of FIG. 5.

In the cases of FIGS. 5 and 6, the stabilization time associated with a step voltage width is proportional to the step voltage width. When the step voltage width decreases, the stabilization time can be shortened. Therefore, the control circuit of the present invention sets a stabilization time in accordance with a time constant; the time constant is calculated from the capacitance of a variable capacitance element used in a circuit and the resistance of an AC blocking resistor via which a DC bias voltage is applied to the variable capacitance element. After the elapse of the stabilization time, the control circuit measures circuit characteristics, such as a resonant current, and then sets the stabilization time in accordance with the step voltage width of the control voltage. When the step voltage width is narrow, the control circuit attempts to decrease a time for reaching a target value by shortening the stabilization time. In this case, the stabilization time is preferably set to substantially 5 times the time constant ($\approx 5\tau = 10CR$).

Figure 7A:
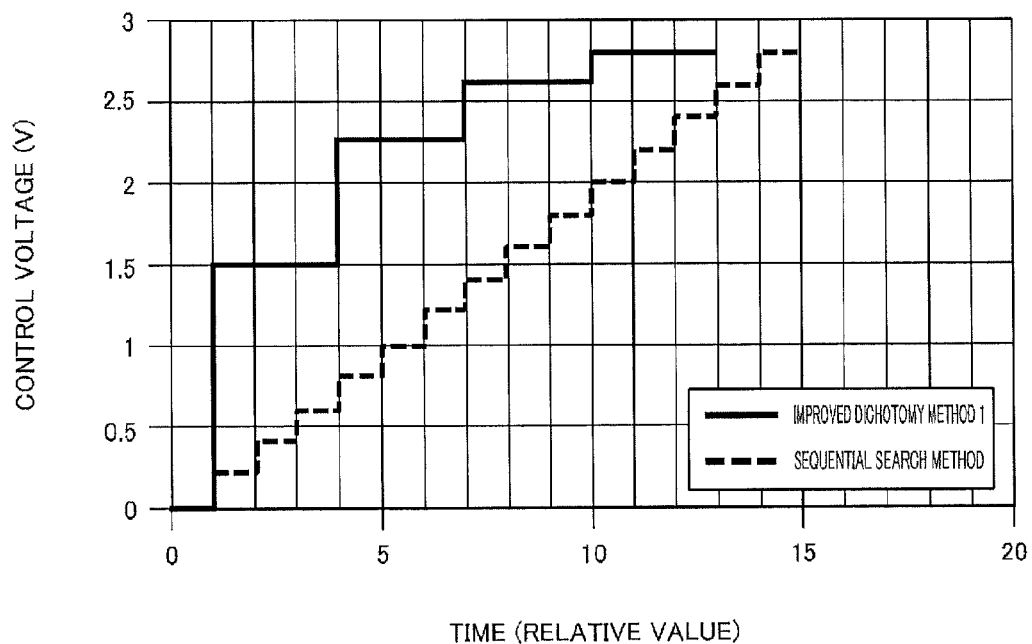
FIG. 7A is a graph that indicates the comparison between a measurement time for searching for a target value with an improved dichotomy method and a measurement time for searching for the same target value with the sequential search method.

FIG. 7A indicates the difference in time for reaching a target value between an improved dichotomy method (improved dichotomy method 1) and the sequential search method; the improved dichotomy method 1 considers the time constant determined by the capacitance of the variable capacitance element and the resistance of the AC blocking resistor. The improved dichotomy method 1 represented by the solid line makes it possible to shorten a time for reaching the target value by an amount proportional to a decreased number of steps, in comparison with the sequential search method represented by the broken line.

When a normal dichotomy method is initiated at 0 V, the initial step width is set to the maximum, or 3 V. When the improved dichotomy method is initiated, the initial step width is set to ½ of the maximum voltage. By setting the step voltage width to ½ of the maximum, the stabilization time can be shortened, because the stabilization time is proportional to the step voltage width.

Figure 7B:
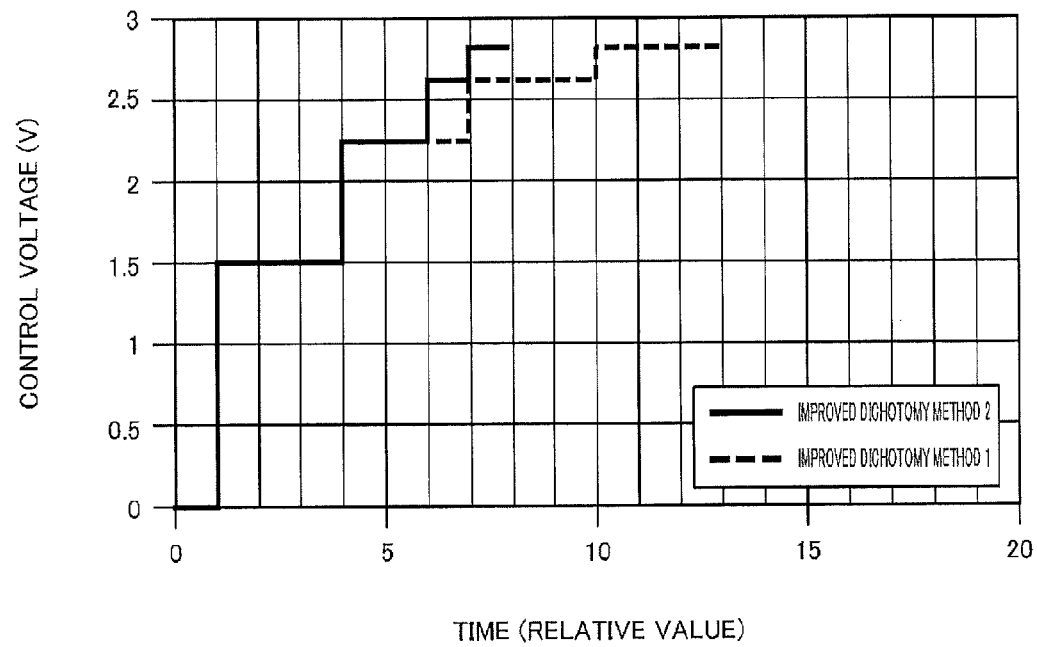
FIG. 7B is a graph that indicates the comparison between measurement times for searching for the same target value with the improved dichotomy method of FIG. 7A (dichotomy method 1) and a further improved dichotomy method (dichotomy method 2).

In the improved dichotomy method 1, when the time constant, which is determined by the capacitance of the variable capacitance element and the resistance of the AC blocking resistor, is long, it may be difficult to sufficiently shorten a measuring time. However, by changing the stabilization time in accordance with each step voltage width of the control voltage, the measuring time can be shortened. As indicated in FIG. 7B, an improved dichotomy method 2 (indicated by a solid line) in which the stabilization time is set in proportion to a step voltage width of a control voltage can shorten a time for reaching a target value, in comparison with the improved dichotomy method 1 indicated by the broken line.

Figure 8:
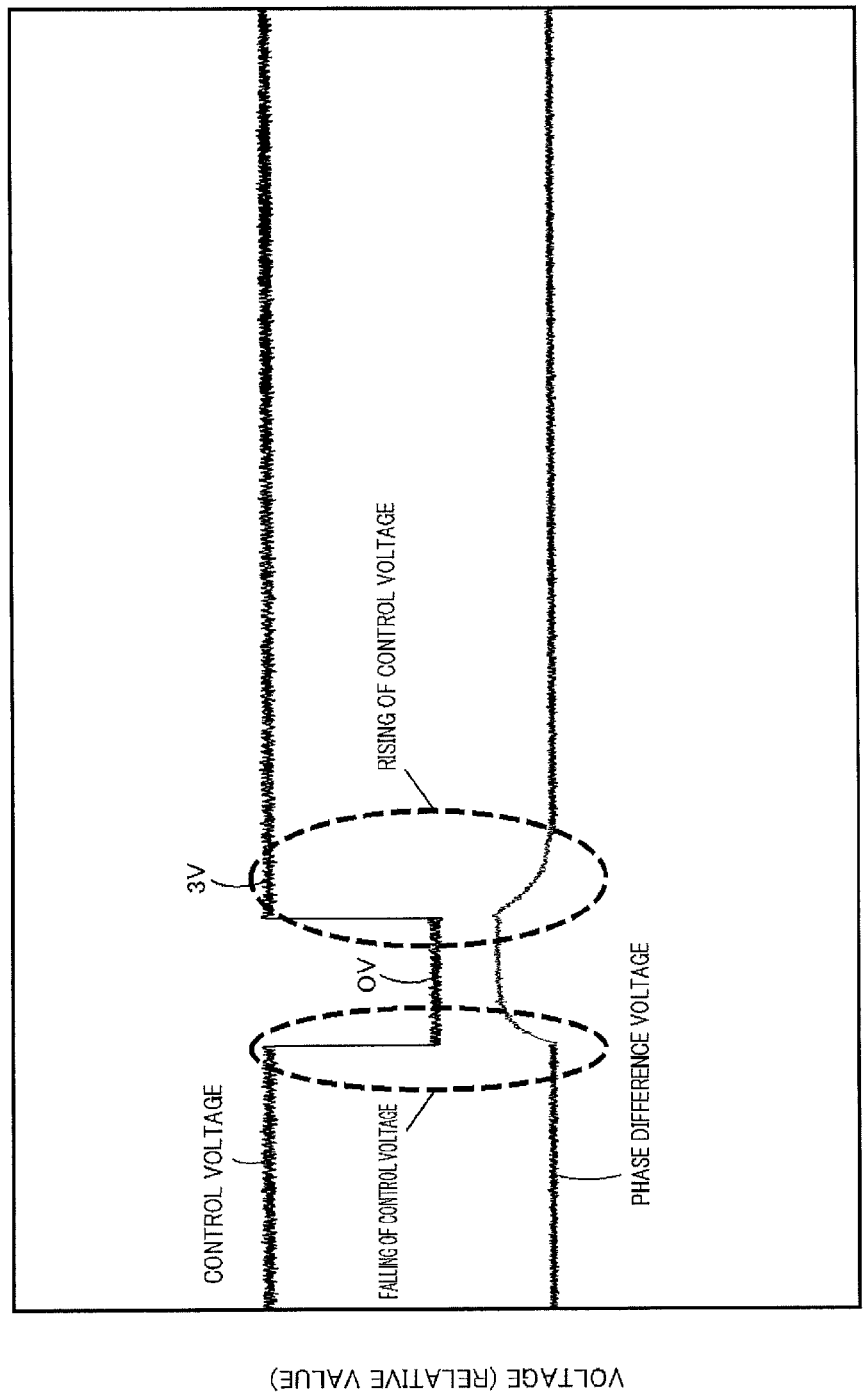
FIG. 8 is a graph indicating that the control voltage has different time constants at its rising and falling portions.

When a step-like control voltage is applied to DC input terminals (DC1 and DC2) 21a and 21b of the variable capacitance capacitor 2 as illustrated in FIG. 8, this control voltage exhibits different time constants at a (rising) portion to which the increasing step voltage is applied and at a (falling) portion to which the decreasing step voltage is applied. More specifically, the time constant at the rising portion of the control voltage is longer than that at the falling portion thereof. Therefore, the stabilization time is changed depending on the direction in which the control voltage changes in a stepwise manner with the above improved dichotomy methods, whereby the measuring time can be further shortened.

3. Operation Sequence of Control Circuit

Figure 9:
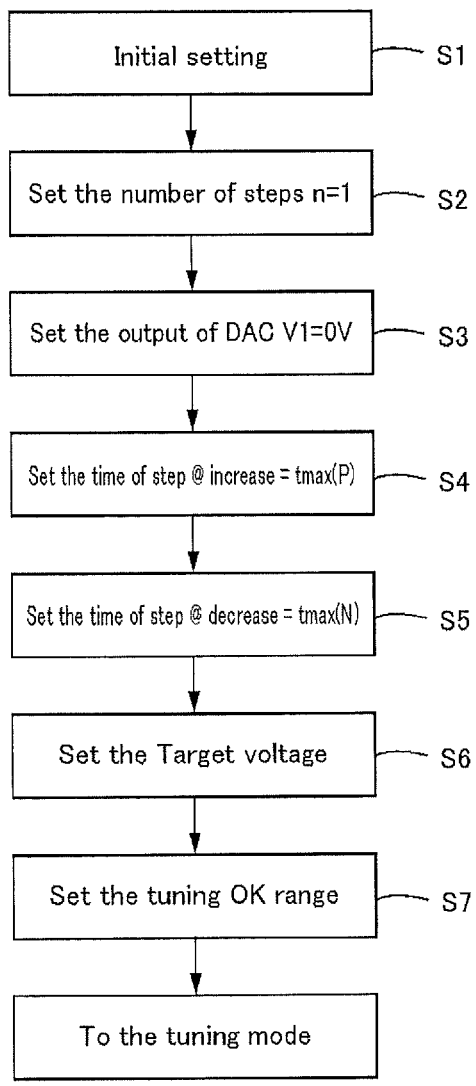
FIG. 9 is an exemplary flowchart for performing an operation of the control circuit and is a flowchart for performing initial setting.
Figure 10:
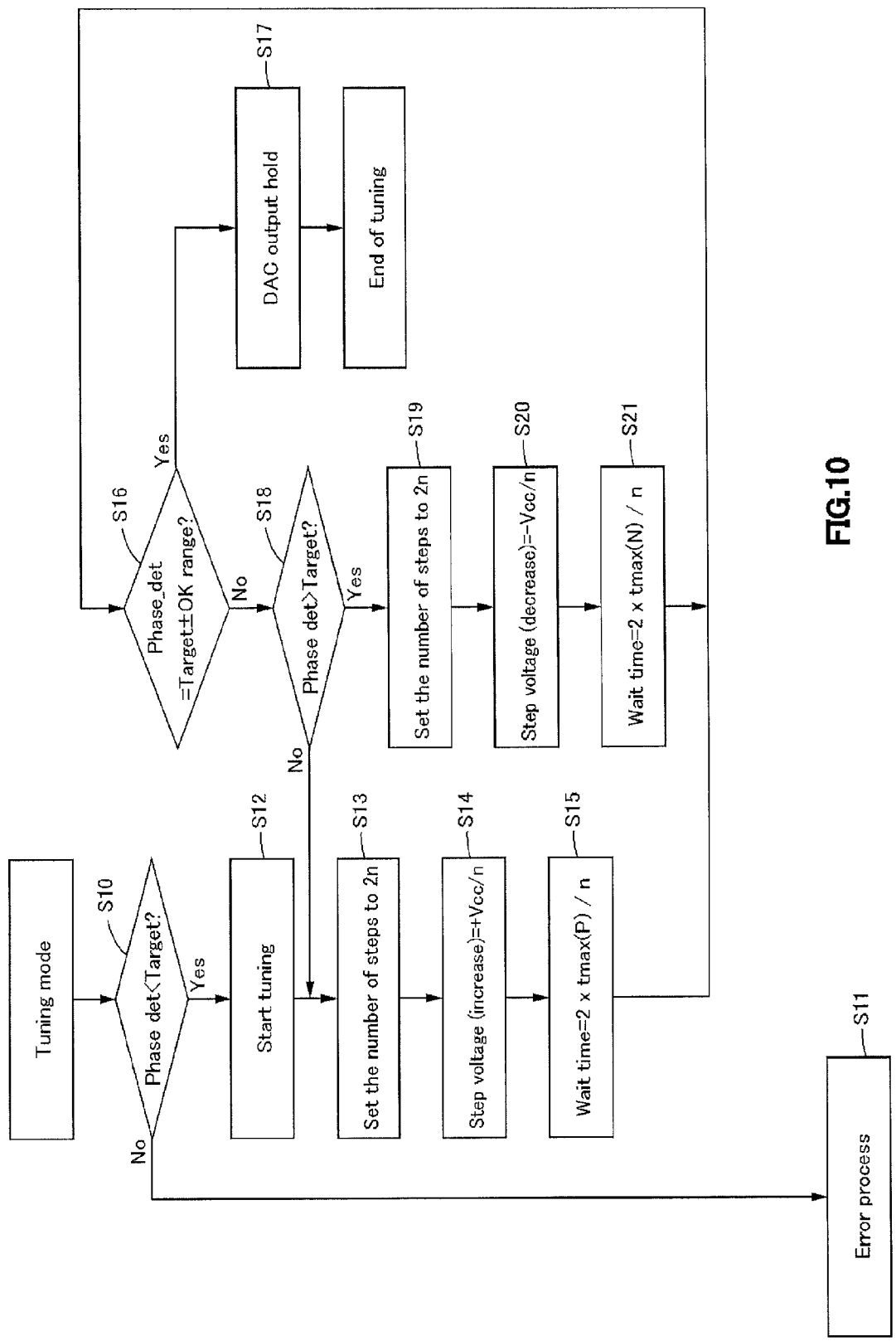
FIG. 10 is an exemplary flowchart for performing the operation of the control circuit and is a flowchart in which the control circuit initialized in accordance with the flowchart of FIG. 9 searches for a target value with the improved dichotomy method.

FIGS. 9 and 10 are exemplary flowcharts of a sequence for achieving the above operation of the control circuit. In the flowchart illustrated in FIG. 9, an operation sequence of the control circuit is initially set, and a tuning mode in which the resonant frequency is tuned is set. The flowchart of FIG. 10 displays an operation sequence in the tuning mode, more specifically an operation sequence of an improved dichotomy method.

As illustrated in FIG. 9, at Step S1, the control section 10 starts initial setting in the tuning mode. The following steps will be performed by the operation of the control section 10. It is preferable that programs containing the respective steps be stored in the memory 10b, and read and executed in order by the processing section 10a.

At Step S2, the control section 10 sets the initial number n of steps for the control voltage (Vcont) 19 to 1. At Step S3, the control section 10 sets the output of the DAC 11 that outputs the control voltage (Vcont) 19 to 0 V.

At the next step, the DAC 11 sets the maximum of a wait time between when the control voltage (Vcont) 19 is applied and when the resonant frequency is measured. More preferably, at Step S4, the control section 10 sets the maximum (tmax (P)) of a wait time when the control voltage (Vcont) 19 is changed in the increasing direction. At Step S5, the control section 10 sets the maximum (tmax (N)) of a wait time when the control voltage (Vcont) 19 is changed in the decreasing direction. In this case, the stabilization time ($\approx 2\tau = 10CR$) or a value obtained by multiplying the stabilization time by a preset margin may be used as the wait time.

At Step S6, the control section 10 sets the target value (Target) 18 to be searched for. At Step S7, the control section 10 sets an OK range as ±allowable range voltage for the target value (Target) 18.

As illustrated in FIG. 10, the control circuit 1 that has been subjected to the initial setting of FIG. 9 and entered the tuning mode will operate in the following sequence. The control circuit 1 operates by virtue of the effect of the control section 10, similar to the initial setting.

This embodiment employs the configuration in which when the control voltage (Vcont) 19 increases, the output voltage (Phase_det) 17 of the phase detector 12 decreases. Thus, at Step S10, the control section 10 determines whether the output voltage (Phase_det) 17 of the phase detector 12 that has received the input signal (REF) 15 to enter the resonating section and the output signal (MONITOR) 16 output from the resonating section is lower than the target value (Target) 18. If the output voltage (Phase_det) 17 is higher than the target value (Target) 18 that has been set upon the initial setting, the control section 10 determines that the tuning is impossible and performs an error process at Step S11. If the output voltage (Phase_det) 17 is lower than the target value (Target) 18, the operation proceeds to Step S12 and subsequent steps and starts the tuning operation.

At Step S13, the control section 10 sets the number n of steps for the control voltage to 2n.

At Step S14, the control section 10 sets the step voltage in the increasing direction to VCC/n. In this case, VCC denotes the maximum of the output voltage (control voltage Vcont) of the DAC 11.

At Step S15, the control section 10 sets the wait time that starts when the DAC 11 outputs the control voltage (Vcont) 19 to 2×tmax (P)/n.

At Step S16, if the output voltage (Phase_det) 17 of the phase detector 12 falls within the target value (Target) 18±OK range, the control section 10 considers that the output voltage (Phase_det) 17 has reached the target value (Target) 18. So, at Step S17, the control section 10 holds the current output voltage of the DAC 11 and terminates the tuning mode. If the output voltage (Phase_det) 17 of the phase detector 12 falls outside the target value (Target) 18±OK range, the operation proceeds to the next step, or Step S18.

At Step S18, the control section 10 checks the magnitude relationship between the output voltage (Phase_det) 17 of the phase detector 12 and the target value (Target) 18. If the output voltage (Phase_det) 17 is lower than the target value (Target) 18, the operation returns to Step S13. Then, the control section 10 newly sets the number of steps and halves the search range, and repeats the operations of Steps S13 to S16. If the output voltage (Phase_det) 17 is higher than the target value (Target) 18, the operation proceeds to the next step, or Step S19. Since the output voltage (Phase_det) 17 of the phase detector 12 is inverted at Step S16, the control section 10 searches for the target value (Target) 18 in the deceasing direction of the step voltage at the next step, or Step S19.

At Step S19, the control section 10 sets the number n of steps to 2n. At Step S20, the control section 10 sets the step voltage width in the decreasing direction to −VCC/n. At Step S21, the control section 10 sets the wait time to 2×tmax (N)/n.

After that, operation returns to Step S16. Then, the control section 10 repeats the above operation until the output voltage (Phase_det) 17 of the phase detector 12 falls within the target value (Target) 18±OK range.

4. Exemplary Operation of Control Circuit

Figure 11A:
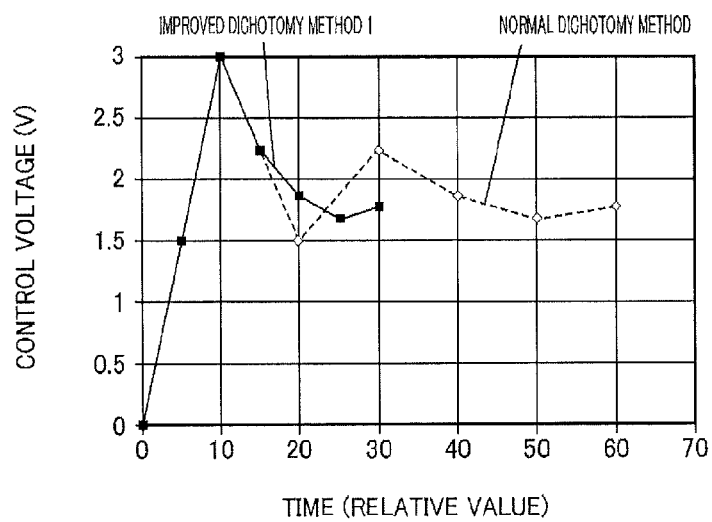
FIGS. 11A to 11C are each a graph that indicates the comparison between measurement times for reaching a target value with an improved dichotomy method and a normal dichotomy method.
Figure 11B:
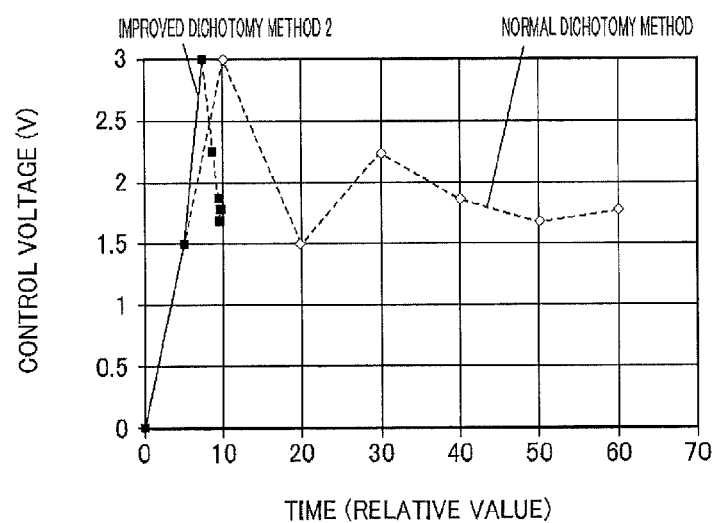
Figure 11C:
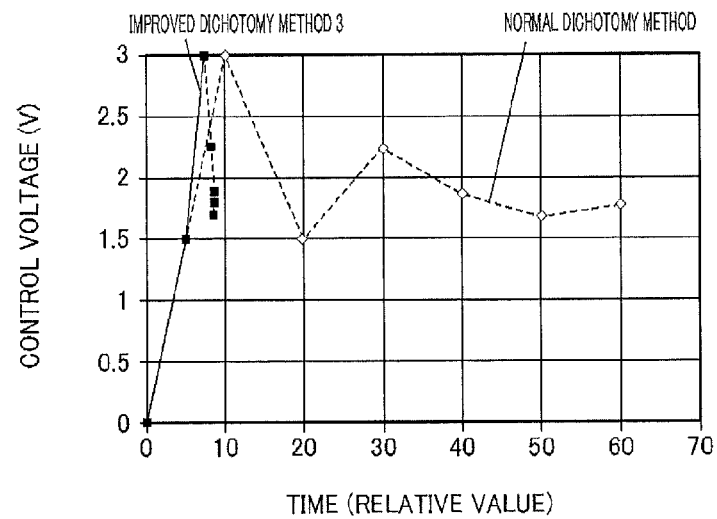

The measuring time was obtained when the control circuit 1 illustrated in FIG. 1 operated in accordance with the above operation flow. FIGS. 11A to 11C each indicate the comparison between the measuring times when the target value was measured with a dichotomy method typically used and when the target value was measured with the above improved dichotomy method.

FIG. 11A indicates the measuring time for the improved dichotomy method 1. In this method, the wait time for the control voltage (Vcont) 19 increases in proportion to the step voltage width of the control voltage (Vcont) 19, and by utilizing this property, the initial voltage is set to ½ of the maximum of the control voltage (Vcont). The wait times for respective steps are the same as one another. In the flowchart of FIG. 10, both tmax (P) and tmax (N) are set to tmax at Steps S4 and S5, and n for the wait time is fixed to 1 at Steps S15 and S21. This initial setting is the simplest and can decrease the number of steps in the program. The improved dichotomy method 1 can halve the measuring time in comparison with the normal dichotomy method.

FIG. 11B indicates an exemplary measurement with the improved dichotomy method 2. The wait time is changed in steps for the control voltage (Vcont) 19. In the improved dichotomy method 2, both tmax (P) and tmax (N) are set to tmax at Steps S4 and S5 in the flowchart of FIG. 10, and the wait times for Steps S15 and S21 are changed in accordance with the step voltage width. Since the step voltage width of the control voltage (Vcont) 19 decreases from step to step in the dichotomy method, and in proportion to this, the wait time is also set to be shorter (Steps S13 to S15 and Steps S19 to S21 in FIG. 10). The measuring time is decreased to approximately ⅙ of the measuring time for the normal dichotomy method.

FIG. 11C indicates the improved dichotomy method 3. The stabilization time is changed in steps for the control voltage (Vcont) 19, and the wait time for the falling portion of the control voltage (Vcont) 19 is set to be shorter than the rising portion thereof. The improved dichotomy method 3 can decrease the measuring time more than ⅙ of the measuring time for the normal dichotomy method.

5. Exemplary Configuration of Electronic Device

The control circuit of the present invention is used for a resonant circuit used in noncontact communicating devices, antenna circuits in noncontact charging devices and any other devices and control circuits that control a resonant frequency of such devices and circuits. The control circuit is used to tune a resonant frequency depending on a usage condition.

(1) Exemplary Configuration of Noncontact Communicating Device

A resonant circuit that includes resonant capacitors and resonant coils is mounted in a noncontact communicating device, and is used to communicate with another noncontact communicating device in a noncontact manner. The noncontact communicating device is a noncontact communication module 150 conforming to the NFC (Near Field Communication) or the like which is mounted, for example in a portable phone. The other noncontact communicating device is a reader/writer 140, for example in a noncontact communication system.

Figure 12:
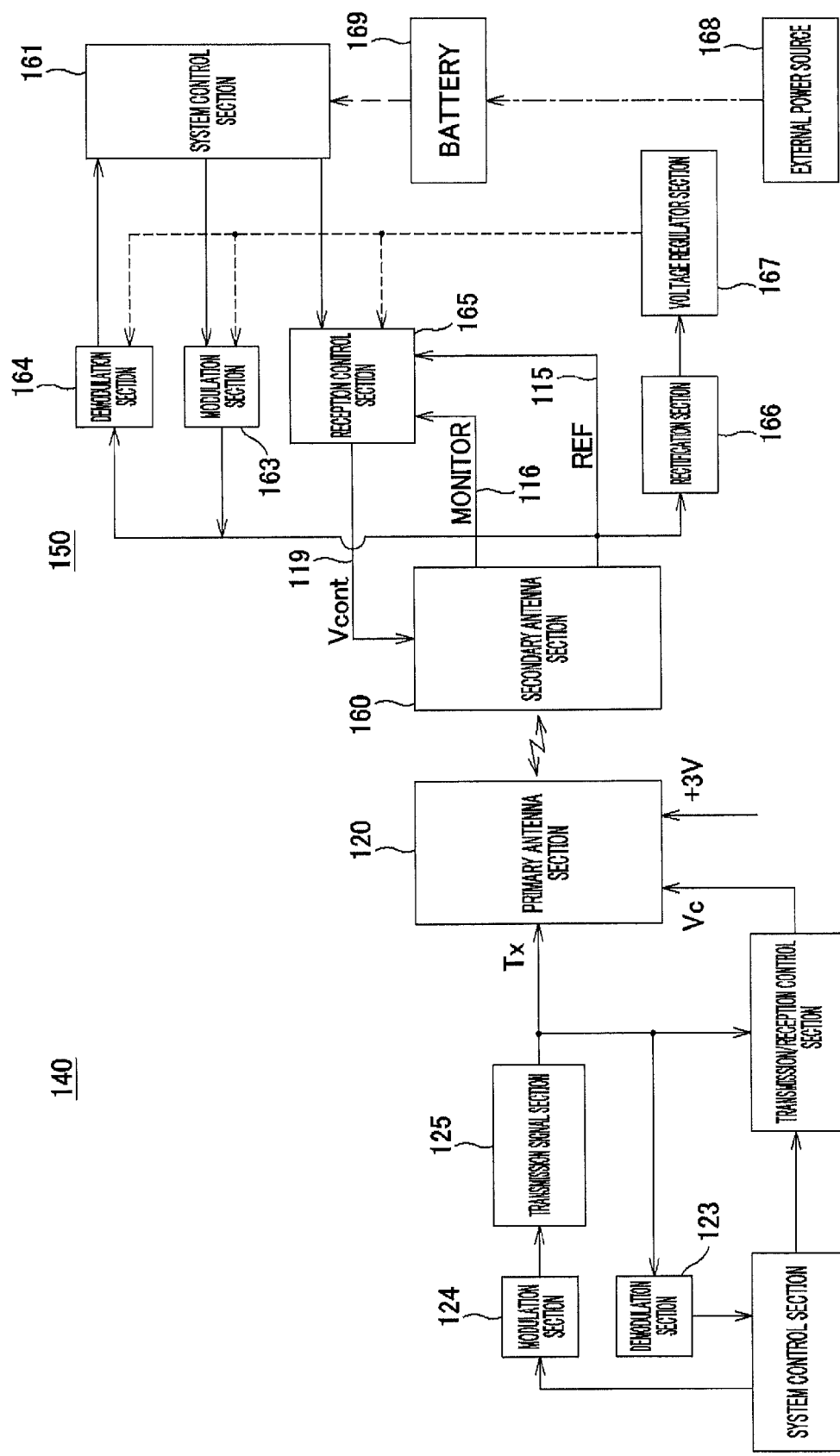
FIG. 12 is a block diagram of an exemplary noncontact communication system.

As illustrated in FIG. 12, the noncontact communication module 150 includes a secondary antenna section 160 that has a resonant circuit formed of: a resonant capacitor including variable capacitance capacitors; and a resonant coil. The noncontact communication module 150 includes: a rectification section 166 that converts an AC signal transmitted from the reader/writer 140 into DC power by rectifying the AC signal in order to use the AC signal as a power source for individual blocks; and a voltage regulator section 167 that generates voltages corresponding to the blocks. The noncontact communication module 150 includes: a demodulation section 164; a modulation section 163; and a reception control section 165 that operate with the DC power supplied from the voltage regulator section 167. In addition, the noncontact communication module 150 includes a system control section 161 that controls operations of the entire module. When the secondary antenna section 160 receives a signal, the rectification section 166 converts the signal into DC power, and a demodulation section 164 demodulates the signal. Then, the system control section 161 analyzes data transmitted from the reader/writer 140. The system control section 161 generates data to be transmitted from the noncontact communication module 150. The modulation section 163 modulates the transmission data to generate a signal to be transmitted to the reader/writer 140. The secondary antenna section 160 transmits the signal. The reception control section 165 tunes the resonant frequency of the secondary antenna section 160 in accordance with the control sequence of the system control section 161. The reception control section 165 receives an input signal (REF) 115 for the secondary antenna section 160 and an output signal (MONITOR) 116 for the secondary antenna section 160, and compares the phases of these signals. As a result of comparing the input and output signals, the reception control section 165 controls a control voltage (Vcont) 119 such that the resonant frequency of the secondary antenna section 160 matches a target value, or the resonant frequency transmitted from the primary antenna section 120.

The reader/writer 140 in the noncontact communication system includes a primary antenna section 120 that includes a resonant circuit having a variable capacitance circuit made of a resonant capacitor and a resonant coil. The reader/writer 140 includes: a system control section 121 that controls operations of the reader/writer 140; a modulation section 124 that modulates a transmission signal on the basis of an instruction from the system control section 121; and a transmission signal section 125 that transmits, to the primary antenna section 120, a carrier signal modulated by the transmission signal from the modulation section 124. Furthermore, the reader/writer 140 includes a demodulation section 123 that demodulates the modulated carrier signal transmitted from the transmission signal section 125.

Obviously, the reader/writer 140 may also be equipped with a function of automatically tuning a resonant frequency, which is similar to that of the noncontact communication module 150.

(2) Operation of Noncontact Communicating Device

The reader/writer 140 tunes the impedance matching with the primary antenna section 120 on the basis of the carrier signal transmitted from the transmission signal section 125. The modulation section 124 employs a modulation scheme and an encoding scheme that may be used by general reader/writers, examples of which are a Manchester encoding scheme and an ASK (Amplitude Shift Keying) modulation scheme. The carrier frequency is typically 13.56 MHz.

A transmission/reception control section 122 monitors a transmission voltage and transmission current of the transmitted carrier signal, and tunes the impedance so as to ensure the impedance matching by controlling a variable voltage Vc of the primary antenna section 120.

When the reader/writer 140 transmits a signal, the secondary antenna section 160 in the noncontact communication module 150 receives the signal, and then the demodulation section 164 demodulates the signal. The system control section 161 determines the content of the demodulated signal, and the system control section 161 generates a response signal on the basis of this result. The reception control section 165 tunes the resonant parameter and any other parameters of the secondary antenna section 160 on the basis of the voltage phase and current phase of the reception signal, thereby tuning the resonant frequency such that the reception condition becomes optimum. As described above, the reception control section 165 compares the phase of the input signal (REF) 115 of the reception signal with the phase of the output signal (MONITOR) 116, and tunes the resonant frequency by adjusting the control voltage (Vcont) 119 under the control of the system control section 161.

In the noncontact communication module 150, the modulation section 163 modulates the response signal, and the secondary antenna section 160 transmits the modulated response signal to the reader/writer 140. In the reader/writer 140, the demodulation section 123 demodulates the response signal received by the primary antenna section 120, and the system control section 121 performs a necessary process on the basis of the demodulated content.

(3) Exemplary Configurations of Noncontact Charging Device and Power Receiving Device A control circuit and a resonant circuit that employ the present invention can be implemented using a power receiving device 190: the power receiving device 190 is contained in a portable terminal such as a portable phone and has a secondary battery that is chargeable in a noncontact manner with a noncontact charging device 180. There is no specific limitation on this noncontact charging system; however, an electromagnetic induction system or a magnetic resonance system, for example, is applicable.

Figure 13:
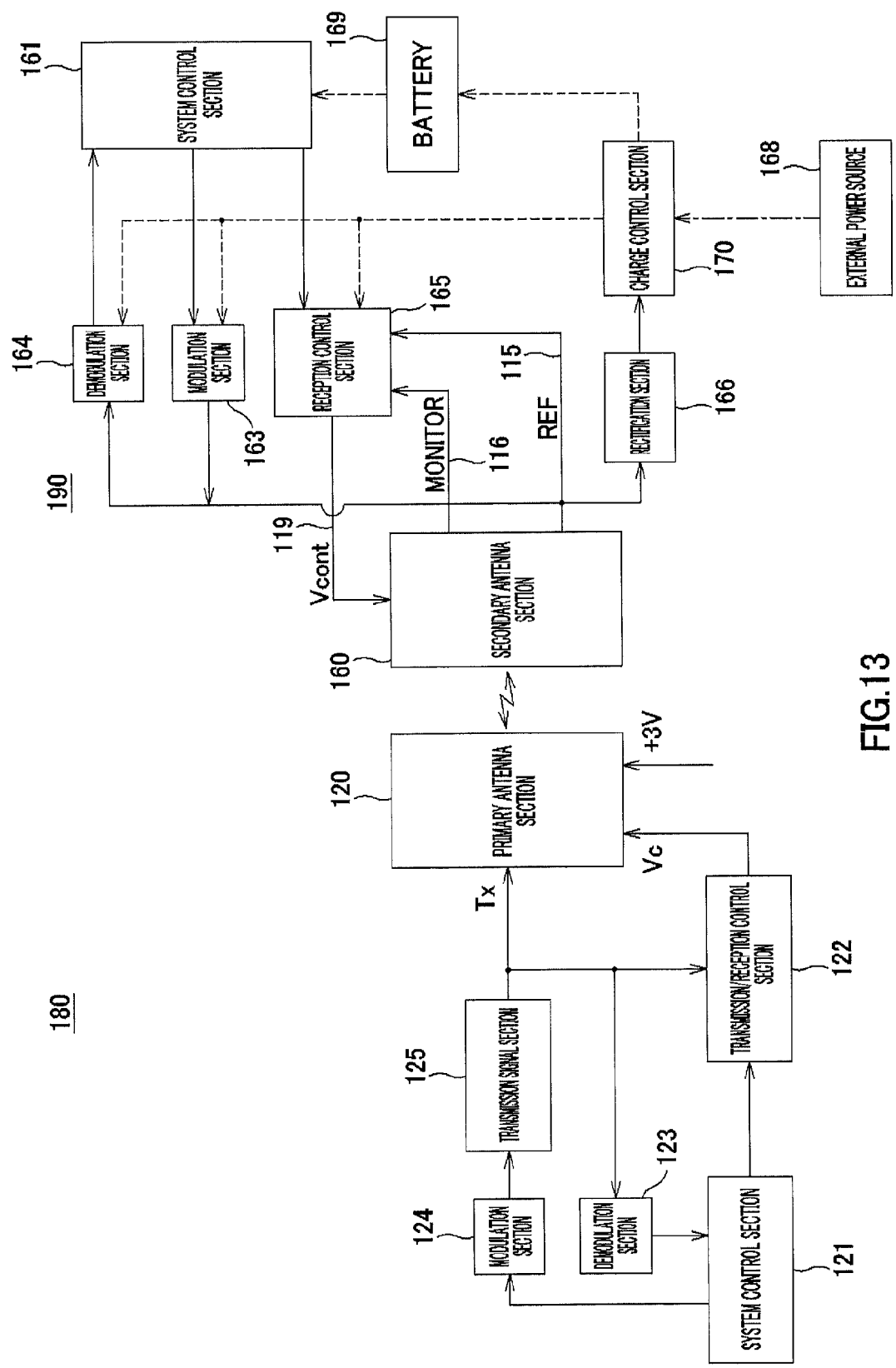
FIG. 13 is a block diagram of an exemplary noncontact charging system.

FIG. 13 illustrates an exemplary configuration of a noncontact charging system; the noncontact charging system includes: the power receiving device 190 for a portable terminal, for example, which employs the present invention;

and the noncontact charging device 180 that charges the power receiving device 190 in a noncontact manner.

The power receiving device 190 has substantially the same configuration as the above noncontact communication module 150. The configuration of the noncontact charging device 180 is substantially that same as the configuration of the above reader/writer 140. Therefore, blocks that have the same functions as corresponding blocks in the reader/writer 140 or the noncontact communication module 150 illustrated in FIG. 12 are denoted by the same reference marks. In many cases, the reader/writer 140 supports a transmission or reception carrier frequency of 13.56 MHz, whereas in some cases, the noncontact charging device 180 supports a transmission or reception carrier frequency of one hundred kHz to several hundred kHz.

The noncontact charging device 180 tunes the impedance matching with a primary antenna section 120, on the basis of a carrier signal transmitted from a transmission signal section 125.

A transmission/reception control section 122 monitors a transmission voltage and transmission current of the transmitted carrier signal, and tunes the impedance so as to ensure the impedance matching by controlling a variable voltage Vc of the primary antenna section 120.

In the power receiving device 190, a secondary antenna section 160 receives a signal, and a rectification section 166 rectifies the signal. A battery 169 is charged with the rectified DC voltage under the control of the charge control section 170. Even if the secondary antenna section 160 receives no signals, the charge control section 170 can be driven by an external power source 168, such as an AC adaptor, so that the battery 169 is charged.

When the noncontact charging device 180 transmits a signal, the secondary antenna section 160 receives this signal, and then the demodulation section 164 demodulates the signal. A system control section 161 determines the content of the demodulated signal, and the system control section 161 generates a response signal on the basis of this result. A reception control section 165 adjusts a control voltage (Vcont) 119 on the basis of a voltage phase (input signal (REF) 115) and a current phase (output signal (MONITOR) 116) of the reception signal, thereby tuning the capacitance of the variable capacitance capacitor in the secondary antenna section 160. In this way, the resonant frequency is tuned such that the reception condition becomes optimum.

GLOSSARY OF DRAWING REFERENCES

1 . . . Control Circuit, 2 . . . variable capacitance capacitor, 3 . . . series resonant capacitor, 4 . . . resonant coil, 5 . . . filter coil, 6 . . . filter capacitor, 7 . . . current sensing resistor, 8 . . . signal input terminal, 10 . . . control section, 11 . . . digital-analog converter, 12 . . . phase detector, 13 . . . digital-analog converter, 14 . . . comparing section, 15 . . . input signal REF), 16 . . . output signal (MONITOR), 17 . . . output signal (Phase_det), 18 . . . target value (Target), 19 . . . control voltage (Vcont), 20*a*, 20*b* . . . AC input terminals, 21*a*, 21*b* . . . DC input terminals, 22~25 . . . variable capacitance elements, 26~30 . . . high-value resistors, 31 . . . AC signal source, 32 . . . output impedance, 33 . . . control voltage source

The invention claimed is:

1. A control circuit for a variable capacitance element, comprising:
a control voltage output section outputting a control voltage consisting of a variable DC voltage;
a plurality of variable capacitance elements each having a capacitance varying with an application of the control voltage; and
a detection section acquiring a characteristic of a circuit containing the plurality of variable capacitance elements,
wherein the control voltage output section is connected to the plurality of variable capacitance elements through a plurality of AC-signal-blocking impedance elements to provide the control voltage to the plurality of variable capacitance elements, and the detection section has a wait time between when the control voltage is applied to the plurality of the variable capacitance elements and when a measurement of the characteristic of the circuit is acquired,
the wait time being set to a plurality of values in accordance with the control voltage, which changes depending on a time constant determined by a product of capacitances of the plurality of variable capacitance elements and resistances of the plurality of AC-signal-blocking impedance elements.

2. The control circuit according to claim 1, wherein the wait time is changed depending on a displacement of the control voltage.

3. The control circuit according to claim 1, wherein the wait time is changed depending on a direction in which the control voltage is displaced.

4. The control circuit according to claim 3, wherein the wait time when the control voltage is decreased is set to be shorter than that when the control voltage is increased.

5. The control circuit according to claim 1, wherein the wait time is changed depending on a displacement of the control voltage and a direction in which the control voltage is displaced.

6. The control circuit according to claim 2, wherein the wait time is made proportional to the displacement of the control voltage.

7. The control circuit according to claim 1, wherein the characteristic of the circuit is a resonant frequency or an impedance of the circuit.

8. A resonant circuit comprising:
the control circuit according to claim 1; and
a resonant coil connected to the control circuit.

9. An electronic device comprising the control circuit according to claim 1.

10. A control method for a variable capacitance element, comprising:
setting a capacitance of a plurality of variable capacitance elements by applying a control voltage with a control voltage output section that outputs a variable DC voltage; and
measuring a characteristic of a circuit containing the plurality of variable capacitance elements with a detection section that detects the characteristic of the circuit containing the plurality of variable capacitance elements,
wherein the control voltage output section is connected to the plurality of variable capacitance elements through a plurality of AC-signal-blocking impedance element to provide the control voltage to the plurality of variable capacitance elements, and the detection section has a wait time between when the control voltage is applied to the plurality of variable capacitance elements and when a measurement of the characteristic of the circuit is acquired, the wait time being set to a plurality of values in accordance with the control voltage, which changes depending on a time constant determined by a product of capacitances of the plurality of variable capacitance elements and resistances of the plurality of AC-signal-blocking impedance elements.

11. The control method according to claim 10, wherein the wait time is changed depending on a displacement of the control voltage.

12. The control method according to claim 11, wherein the wait time is made proportional to the displacement of the control voltage.

13. The control method according to claim 10, wherein the wait time is changed depending on a direction in which a control voltage is displaced.

14. The control method according to claim 13, wherein the wait time when the control voltage is decreased is set to be shorter than that when the control voltage is increased.

15. The control method according to claim 10, wherein the wait time is changed depending on a displacement of a control voltage and a direction in which the control voltage is displaced.

16. The control method according to claim 10, wherein the characteristic of the circuit is a resonant frequency or an impedance of the circuit.

17. A non-transitory computer readable medium storing a control program that controls a capacitance of a variable capacitance element, the control program having steps to be executable by a computer, the control program comprising the steps of:
setting a capacitance of a plurality of variable capacitance elements by applying a control voltage with a control voltage output section that outputs a variable DC voltage; and
acquiring a characteristic of a circuit containing the plurality of variable capacitance elements with a detection section that detects the characteristic of the circuit containing the variable capacitance element,
wherein the control voltage output section is connected to the plurality of variable capacitance elements through a plurality of AC-signal-blocking impedance elements to provide the control voltage to the plurality of variable capacitance elements, and the detection section having a wait time between when the control voltage is applied to each of the plurality of variable capacitance elements and when a measurement of the characteristic of the circuit is acquired, the wait time being set to a plurality of values in accordance with the control voltage, whose change depends on a time constant determined by a product of capacitances of the plurality of variable capacitance elements and resistances of the plurality of AC-signal-blocking impedance elements.

18. The non-transitory computer readable medium according to claim 17, wherein
the wait time is changed depending on a displacement of the control voltage.

19. The non-transitory computer readable medium according to claim 18, wherein
the wait time is made proportional to the displacement of the control voltage.

20. The non-transitory computer readable medium according to claim 17, wherein
the wait time is changed depending on a direction in which the control voltage is displaced.

21. The non-transitory computer readable medium according to claim 20, wherein
the wait time when the control voltage is decreased is set to be shorter than that when the control voltage is increased.

22. The non-transitory computer readable medium according to claim 7, wherein
the wait time is changed depending on a displacement of the control voltage and a direction in which the control voltage is displaced.

23. The non-transitory computer readable medium according to claim 17, wherein
the characteristic of the circuit is a resonant frequency or an impedance of the circuit.

24. A semiconductor element comprising the non-transitory computer readable medium according to claim 17.

25. The semiconductor element according to claim 24, further comprising a processing section that loads and executes the control program stored on the non-transitory computer readable medium.

* * * * *